(12) United States Patent
Hadimani et al.

(10) Patent No.: US 9,496,445 B2
(45) Date of Patent: Nov. 15, 2016

(54) HYBRID ENERGY CONVERSION DEVICE

(75) Inventors: Magundappa L. (Ravi) Hadimani, Bolton (GB);
(Continued)

(73) Assignee: University of Bolton, Bolton (GB)

( * ) Notice: Subject to any disclaimer, the term of this patent is extended or adjusted under 35 U.S.C. 154(b) by 662 days.

(21) Appl. No.: 13/876,162

(22) PCT Filed: Sep. 27, 2011

(86) PCT No.: PCT/GB2011/051829
§ 371 (c)(1),
(2), (4) Date: Jun. 7, 2013

(87) PCT Pub. No.: WO2012/042259
PCT Pub. Date: Apr. 5, 2012

(65) Prior Publication Data
US 2013/0257156 A1 Oct. 3, 2013

(30) Foreign Application Priority Data
Sep. 27, 2010 (GB) .................................. 1016193.3

(51) Int. Cl.
*H01L 35/00* (2006.01)
*H02S 10/10* (2014.01)
(Continued)

(52) U.S. Cl.
CPC ......... *H01L 31/0583* (2013.01); *H01L 27/301* (2013.01); *H01L 27/304* (2013.01);
(Continued)

(58) Field of Classification Search
CPC .................... H01H 31/42; H01H 31/41; H02L 27/142; H02L 27/42; H01L 35/00
(Continued)

(56) References Cited

U.S. PATENT DOCUMENTS 6,291,763 B1 * 9/2001 Nakamura ........... H01G 9/2009
136/252
6,730,208 B1 * 5/2004 Bruel .................... H01L 31/046
136/200
(Continued)

FOREIGN PATENT DOCUMENTS

CN 101640298 A 2/2010
JP H07107752 A 4/1995
(Continued)

OTHER PUBLICATIONS

Choi et al.: "Piezoelectric touch-sensitive flexible hybrid energy harvesting nanoarchitectures".*
(Continued)

*Primary Examiner* — Rexford Barnie
*Assistant Examiner* — Joseph Inge
(74) *Attorney, Agent, or Firm* — Leydig, Voit & Mayer, Ltd

(57) ABSTRACT

A piezoelectric-photovoltaic hybrid structure is described, having a plurality of superposed layers including a photovoltaic layer and a piezoelectric substrate. A method of forming such a structure is also described, including the steps of providing a piezoelectric substrate and superposing a photovoltaic layer over the substrate. A power conversion system is described, comprising such a hybrid structure with a first circuit connected to the piezoelectric substrate and a second circuit connected to the photovoltaic layer. Also discussed is a method of generating, storing, distributing, or consuming electrical energy, involving the use of such a system in connection with a distribution circuit or network, electrical load, or energy storage device. A further power conversion system is described where the piezoelectric and photovoltaic circuits are connected to a single, or a respec-
(Continued)

tive, DC-DC converter. A set of such power conversion systems may be connected in series at their output terminals.

19 Claims, 8 Drawing Sheets

(75) Inventors: Elias Siores, Manchester (GB);
Derman Vatansever, Muratli (TR);
Kleanthis Prekas, Ilion (GR)

(51) Int. Cl.
*H01L 27/30* (2006.01)
*H01L 41/113* (2006.01)
*H02N 2/18* (2006.01)
*H02J 1/12* (2006.01)
*H02J 7/34* (2006.01)
*H02S 40/38* (2014.01)
*H01L 51/00* (2006.01)
*H01L 51/42* (2006.01)
*H02J 1/10* (2006.01)

(52) U.S. Cl.
CPC ........... *H01L 41/113* (2013.01); *H02J 1/12* (2013.01); *H02J 7/345* (2013.01); *H02N 2/181* (2013.01); *H02N 2/186* (2013.01); *H02S 10/10* (2014.12); *H02S 40/38* (2014.12); *H01L 51/0036* (2013.01); *H01L 51/0037* (2013.01); *H01L 51/4253* (2013.01); *H02J 1/10* (2013.01); *Y02E 10/542* (2013.01); *Y10T 307/527* (2015.04); *Y10T 307/707* (2015.04)

(58) Field of Classification Search
USPC ................ 307/48; 257/E27.123; 136/243
See application file for complete search history.

(56) References Cited

U.S. PATENT DOCUMENTS

| | | | |
|---|---|---|---|
| 7,235,736 B1 | 6/2007 | Buller et al. | |
| 7,973,456 B2* | 7/2011 | Tanaka et al. | 310/358 |
| 8,192,789 B2* | 6/2012 | Albano | H01M 4/0421 |
| | | | 204/192.15 |
| 8,329,503 B1* | 12/2012 | Nielson | H01L 31/0543 |
| | | | 257/E27.125 |
| 8,981,213 B1* | 3/2015 | Micallef | H01L 41/113 |
| | | | 136/243 |
| 2005/0005964 A1* | 1/2005 | Komatsu | H01L 51/0097 |
| | | | 136/263 |
| 2006/0180195 A1* | 8/2006 | Luch | H01L 31/0392 |
| | | | 136/244 |
| 2008/0173345 A1* | 7/2008 | Cochran | H02N 2/185 |
| | | | 136/248 |
| 2010/0040102 A1* | 2/2010 | Ahn | B82Y 20/00 |
| | | | 372/45.012 |
| 2010/0072859 A1* | 3/2010 | Jager | H01L 41/1138 |
| | | | 310/323.21 |
| 2010/0231046 A1* | 9/2010 | Doraisamy | H01L 35/30 |
| | | | 307/48 |
| 2012/0219831 A1* | 8/2012 | Mak | B82Y 10/00 |
| | | | 429/9 |

FOREIGN PATENT DOCUMENTS

| | | |
|---|---|---|
| JP | H07297461 A | 11/1995 |
| JP | 2002039873 A | 2/2002 |
| JP | 200532852 A | 2/2005 |
| JP | 2008507133 A | 3/2008 |
| JP | 2008159867 A | 7/2008 |
| JP | 2009076668 A | 4/2009 |
| JP | 2009530858 A | 8/2009 |

OTHER PUBLICATIONS de Villiers et al.: "Energy harvesting for a condition monitoring mote".*
Guilar et al.: "An energy-aware multiple-input power supply with charge recovery for energy harvesting applications".*
International Search Report corresponding to PCT/GB2011/051829 mailed Oct. 30, 2012 (4 pages).
Choi D et al., "Piezoelectric Touch-Sensitive Flexible Hybrid Energy Harvesting Nanoarchitectures," Nanotechnology, Sep. 10, 2010, vol. 21, pp. 405503/1-6
De Villiers D J et al., "Energy Harvesting for a Condition Monitoring Mote," 34th Annual Conferenec of IEEE Industrial Electronics Society (IECON 2008), Nov. 10-13, 2008, Orlando FL, USA, pp. 2161-2166.
Guilar N J et al., "An Energy-Aware Multiple-Input Power Supply With Charge Recovery for Energy Harvesting Applications," 2009 IEEE International Solid-State Circuits Conference (ISSCC 2009), Feb. 8-12, 2009, San Frnacisco, CA, USA, pp. 298-299, 299a.
Colomer-Farrarons J et al., "A Multiharvested Self-Powered System in a Low-Voltage Low-Power Technology," IEEE Transactions on Industrial Electronics, Sep. 1, 2011, vol. 58, No. 9, pp. 4250-4263.

* cited by examiner ions at different scales and in different structural forms, such as in the form of films or sheets, as well as fibres.

HYBRID ENERGY CONVERSION DEVICE

TECHNICAL FIELD OF THE INVENTION

The present invention relates to hybrid piezoelectric and photovoltaic materials and structures, and to power conversion systems and circuitry for such materials and structures.

BACKGROUND TO THE INVENTION

The availability of flexible photovoltaic and piezoelectric materials, coupled with increasing pressures to efficiently capture energy from renewable sources, makes the use of both piezoelectric and photovoltaic technologies, simultaneously and/or at the same location, an increasingly attractive possibility. A hybrid structure comprising both technologies may be deployed to harvest energy both from solar energy and from mechanical energy sources such as rain, wind, waves, or tides. A flexible piezoelectric polymer may be used to harvest mechanical energy and at the same time may act as a substrate material for organic photovoltaic cells.

WO 2009/070706 describes the use of flexible organic solar cells for artificial turf to generate solar energy. The use of such a system would be limited by the availability of sunlight to certain periods of the day. The structure specified in the above patent is incapable of using mechanical energy.

U.S. Pat. No. 7,705,523 B2 describes a hybrid device using dye-sensitised solar cells and zinc oxide (ZnO) piezoelectric nano-rods for converting both solar and mechanical energy to electrical energy. The hybrid structure can be developed only in the form of fibres, but not as films or sheets. Films or sheets may be desirable in certain applications, for example, in energy harvesting where mechanical energy from water or wind is converted to electricity. The hybrid structure described in U.S. Pat. No. 7,705,523 B2 may not be modified to accommodate other kinds of less expensive solar cells, such as organic solar cells or amorphous silicon solar cells. The structure is also highly complex, featuring a hierarchical structure including tubules with radiating nano-rods. A simplified structure is desirable both for enabling simpler production methods and for allowing the use of such hybrid piezoelectric-photovoltaic technologies at different scales and in different structural forms, such as in the form of films or sheets, as well as fibres.

An aim of embodiments of the present invention is therefore to provide an improved method of storing, consuming, and/or generating electrical energy scavenged from both solar and mechanical sources. Another aim of embodiments of the invention is to provide an improved power generation system for harvesting both solar and mechanical energy for use with such a method. A further aim of embodiments of the present invention is to provide a hybrid structure having piezoelectric and photovoltaic characteristics for use in such a system. Yet another aim of embodiments of the invention is to provide a method for making such a structure.

SUMMARY OF THE INVENTION

According to a first aspect of the invention, there is provided a piezoelectric-photovoltaic structure for converting solar and mechanical energy into electrical energy, having a plurality of superposed layers including a photovoltaic layer and a piezoelectric substrate.

Such a hybrid structure could function to harvest energy from multiple renewable sources through a single multi-source energy capture system. This may lead to energy capture systems that collect energy more effectively, or are more cost effective, robust, lightweight or deployable than comparable single-source energy capture systems.

Advantageously, the piezoelectric substrate is directly interposed between a top electrode and a bottom electrode.

Preferably, the photovoltaic layer is interposed between an outer anode layer and an inner cathode layer. An insulating layer may separate the piezoelectric substrate and the top and bottom electrodes from the photovoltaic layer, cathode and anode. Advantageously, the photovoltaic layer further comprises an outer sub-layer of a transparent electron blocker (hole extractor) polymer and an inner sub-layer of electron donor and electron acceptor (donor-acceptor) polymers.

The electron blocker polymer layer may comprise poly (3,4-ethylenedioxy-thiophene) and polystyrenesulfonate (PEDOT:PSS), or may comprise poly-tetrafluoroethylene (PTFE).

The electron donor-acceptor polymer layer may comprise poly(3-hexylthiophene) and [6,6]-phenyl-C61-butyric acid methyl ester (P3HT+PCBM), or may comprise poly(p-phenylenevinylene) and poly(2-methoxy-5-propyloxy-sulfonate-1,4-phenylene-vinylene) (PPV+MPS-PPV), or may comprise poly[2-methoxy-5-(2'-ethyl-hexyloxy)-1,4-phenylenevinylene] and [6,6]-phenyl-C61-butyric acid methyl ester (MEH-PPV+PCBM), or may comprise poly[2-methoxy-5-(3',7'-dimethyloctyloxyl)]-1,4-phenylenevinylene and [6,6]-phenyl-C61-butyric acid methyl ester (MDMO-PPV+PCBM), or may comprise poly(p-phenylenevinylene) and fullerene (PPV+C60), or may comprise poly (3-octylthiophene) and [6,6]-phenyl-C61-butyric acid methyl ester (P3OT+PCBM), or may be [6,6]-phenyl-C61-butyric acid methyl ester and poly[2,6-(4,4-bis-(2-ethylhexyl)-4H-cyclopenta[2,1-b;3,4-b']dithiophene)-alt-4,7-(2, 1,3-benzothiadiazole)] (PCBM+PCDTBT), or may comprise poly[N-dodecyl-2,5-bis(2'-thienyl)pyrrole-(2,1,3-benzothiadiazole)] and [6,6]-phenyl-C61-butyric acid methyl ester (PTPTB+PCBM).

The electron donor-acceptor polymer layer may contain dispersed carbon nanotubes. The anode and cathode layers are preferably metallic, the anode layer having a higher work function than the cathode layer. Advantageously, the material of the anode layer is distributed to only partially cover the photovoltaic layer. Preferably, the material of the anode layer is distributed sparsely over the photovoltaic layer in the form of a lattice or comb structure. Advantageously, the anode layer may be copper. Preferably, the cathode layer may be aluminium.

In one preferred embodiment of the present invention, the structure may comprise an elongate substantially cylindrical body with said layers superposed concentrically. The substantially cylindrical body may be a fibre. The structure may comprise a plurality of said fibres that are woven, braided or otherwise arranged in the form of a textile or cord.

In another preferred embodiment, the structure may comprise a planar body having said layers superposed substantially in parallel thereto. The planar body may be a sheet or film.

Preferably, the top and bottom electrodes are metallic. Conveniently, the top and bottom electrodes may be aluminium.

The cathode layer and the photovoltaic layer may advantageously be separated by an interposed layer of lithium fluoride.

The piezoelectric substrate may comprise a polymer. Preferably, the piezoelectric substrate comprises poly(vinylidene fluoride) (PVDF) or polypropylene or nylon. The piezoelectric substrate may include dispersed piezoelectric ceramic particles.

The photovoltaic layer may comprise dye-sensitised photovoltaic cells.

According to a second aspect of the present invention, there is provided a method of forming a piezoelectric-photovoltaic structure, the method including the steps of providing a piezoelectric substrate and superposing a photovoltaic layer over the substrate.

Advantageously, the method may include the step of depositing a top electrode and a bottom electrode onto the piezoelectric substrate prior to superposing the photovoltaic layer. The method may include the step of superposing an insulating layer over the substrate prior to superposing the photovoltaic layer. Preferably, superposing the photovoltaic layer includes the steps of overlaying a cathode layer, overlaying a layer comprising electron donor and electron acceptor polymers over the cathode layer, depositing a layer of a transparent electron blocker (hole extractor) polymer onto the electron donor-acceptor polymer layer, and depositing an anode layer onto the transparent electron blocker polymer layer. Advantageously, the method may include the step of depositing a layer of lithium fluoride onto said cathode layer prior to depositing said electron donor-acceptor polymer layer thereupon.

Preferably, the top and bottom electrode are metallic and are deposited onto the piezoelectric substrate by thermal evaporation. Advantageously, the cathode layer is metallic and is deposited by thermal evaporation. Conveniently, the anode layer is metallic and is deposited onto the transparent electron blocker (hole extractor) polymer layer by thermal evaporation.

Preferably, the step of providing a piezoelectric substrate may include forming said substrate by an extrusion process. The piezoelectric substrate may be extruded from a feed that comprises polymer granules. The piezoelectric substrate may be extruded from a feed that comprises composite granules containing dispersed piezoelectric ceramic particles in a polymer matrix.

Advantageously, the layer of electron donor-acceptor polymer may be formed by depositing a coating of a polymer solution using a spin-coating or a dip-coating method. Alternatively, the layer of electron donor-acceptor polymer may be formed by depositing a coating of a polymer solution using a casting, screen printing, doctor blading, or inkjet printing method.

The polymer solution used to form the electron donor-acceptor polymer layer may comprise a mixture of poly(3-hexylthiophene) (P3HT) and [6,6]-phenyl-C61-butyric acid methyl ester (PCBM), or poly(p-phenylenevinylene) (PPV) and poly(2-methoxy-5-propyloxy-sulfonate-1,4-phenylenevinylene) (MPS-PPV), or poly[2-methoxy-5-(2'-ethylhexyloxy)-1,4-phenylenevinylene] (MEH-PPV) and PCBM, or poly[2-methoxy-5-(3',7'-dimethyloctyloxyl)]-1,4-phenylenevinylene (MDMO-PPV) and PCBM, or PPV and fullerene (C60), or poly(3-octylthiophene) (P3OT) and PCBM, or PCBM and poly[2,6-(4,4-bis-(2-ethylhexyl)-4H-cyclopenta[2,1-b;3,4-b']dithiophene)-alt-4,7-(2,1,3-benzothiadiazole)] (PCDTBT), or poly[N-dodecyl-2,5-bis(2'-thienyl)pyrrole-(2,1,3-benzothiadiazole)] (PTPTB) and PCBM, said mixture being dissolved in chlorobenzene or 1,2-dichlorobenzene or chloroform.

Advantageously, the polymer solution used to form the electron donor-acceptor polymer layer may comprise a mixture of P3HT and PCBM in a ratio of 1:1 by weight. The polymer solution used to form the electron donor-acceptor polymer layer may include dispersed carbon nanotubes. Preferably, the method may include the step of annealing the electron donor-acceptor polymer layer.

Conveniently, the layer of electron blocker (hole extractor) polymer may be formed by depositing a coating of a polymer solution using a spin- or dip-coating method. Advantageously, the layer of electron blocker polymer may be formed by depositing a coating comprising a solution of a PEDOT:PSS or PTFE. Preferably, the method may include the step of annealing the electron blocker polymer layer.

According to a third aspect of the present invention, there is provided a power conversion system for converting solar and mechanical energy into electrical energy comprising: a piezoelectric-photovoltaic structure having a plurality of superposed layers including a photovoltaic layer and a piezoelectric substrate; a first circuit connected to a top electrode and a bottom electrode of the piezoelectric substrate; and a second circuit connected to an anode and a cathode of the photovoltaic layer.

Advantageously, the first circuit may include a rectifier. Conveniently, the second circuit may include a charge controller. One or both of the first and second circuits may be connected to the terminals of an energy storage device. Conveniently, the energy storage device is a battery.

According to a fourth aspect of the present invention, there is provided a method of generating, storing, distributing, or consuming electrical energy, including: using said power conversion system to convert mechanical or solar energy into electrical energy; and connecting one or both of the first circuit and the second circuit to an electricity distribution circuit or to an electricity distribution network or to an electrical load or to an energy storage device.

According to a fifth aspect of the present invention, there is provided a method of generating and distributing electrical energy, including: using said power conversion system to convert mechanical or solar energy into electrical energy; connecting one or both of the first circuit and the second circuit to an energy storage device; and connecting the energy storage device to an electricity distribution circuit or to an electricity distribution network or to an electrical load.

According to a sixth aspect of the present invention, there is provided a power conversion system for converting solar and mechanical energy into electrical energy comprising: a piezoelectric-photovoltaic structure having a photovoltaic element and a piezoelectric element; a first circuit connected to the piezoelectric element; and a second circuit connected to the photovoltaic element, wherein at least one of the first and second circuits is connected to a DC-DC converter.

The piezoelectric element may be a piezoelectric substrate, wherein the first circuit is connected to a top electrode and a bottom electrode of the piezoelectric substrate. The photovoltaic element may be a photovoltaic layer, wherein the second circuit is connected to an anode and a cathode of the photovoltaic layer. The piezoelectric-photovoltaic structure may be a piezoelectric-photovoltaic structure according to the first aspect of the invention.

The first circuit may include a rectifier, which may be a bridge rectifier. Conveniently, the bridge rectifier is a low drop full wave bridge rectifier. The rectifier may be an integrated chip or a part of an integrated chip. The first circuit may be connected, in parallel with a storage capacitor, to a DC-DC converter. The DC-DC converter may be a step-down converter. The DC-DC converter may be an integrated chip or a part of an integrated chip. The DC-DC converter and the rectifier may form a single integrated chip. Conveniently, the single integrated circuit chip may be an LTC3588 integrated chip, supplied by Linear Technology Corporation (Milpitas, Calif.), or equivalent. The first circuit may comprise a plurality of said piezoelectric elements, and a plurality of said rectifiers, wherein one or more piezoelectric elements are connected to each rectifier and wherein said rectifiers are connected in parallel.

The second circuit may include a voltage regulator, which may be a diode connected in series with the photovoltaic element. Conveniently, the diode may be a Shottky diode. The second circuit may comprise a plurality of said photovoltaic elements connected in series. The second circuit may be connected, in parallel with said storage capacitor, to said DC-DC converter. Alternatively, the second circuit may be connected, in parallel with a second storage capacitor, to a second DC-DC converter, the two converters having their outputs connected.

The, or at least one, DC-DC converter may be connected to an output smoothing circuit. The, or at least one, smoothing circuit may comprise a reservoir capacitor and an inductance. Advantageously, a bypass diode may connect a pair of output terminals of the, or at least one, DC-DC converter, or may connect a pair of output terminals of the, or each, output smoothing circuit. The, or each, bypass diode may be a Shottky diode.

According to a seventh aspect of the invention, there is provided a power conversion array comprising a set of power conversion systems according to the sixth aspect of the invention, wherein the power conversion systems are connected in series at their output terminals.

The set of series-connected power conversion systems may be connected to a final DC-DC converter. The final DC-DC converter may be a step-up converter. The power conversion array may further comprise a plurality of said final DC-DC converters each having input terminals connected to a respective set of series-connected power conversion systems and output terminals connected to a power line bus.

Alternatively, the set of series-connected power conversion systems may be connected to a DC-AC inverter. The power conversion array may further comprise a plurality of said DC-AC inverters each having input terminals connected to a respective set of series-connected power conversion systems and output terminals connected to a power line bus.

DETAILED DESCRIPTION OF THE INVENTION

In order that the invention may be more clearly understood, embodiments thereof will now be described, by way of example only, with reference to the accompanying drawings, of which:

Figure 8:
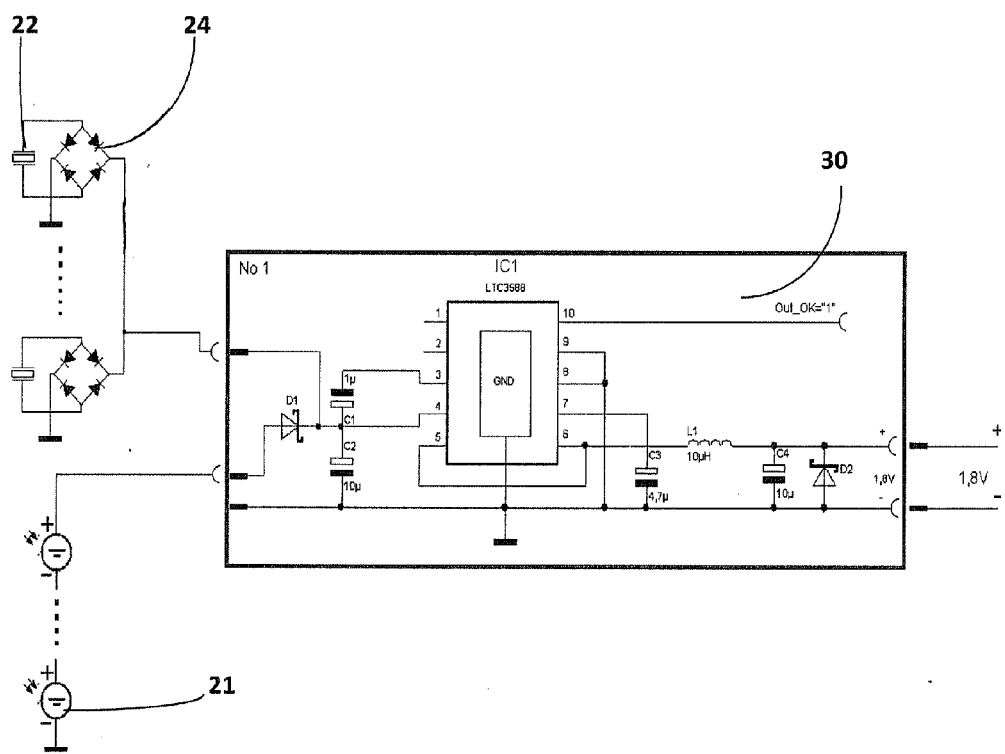
FIG. 8 is a circuit diagram showing the unit cell of FIG. 6 comprising a plurality of piezoelectric elements and a plurality of photovoltaic elements.
Figure 9:
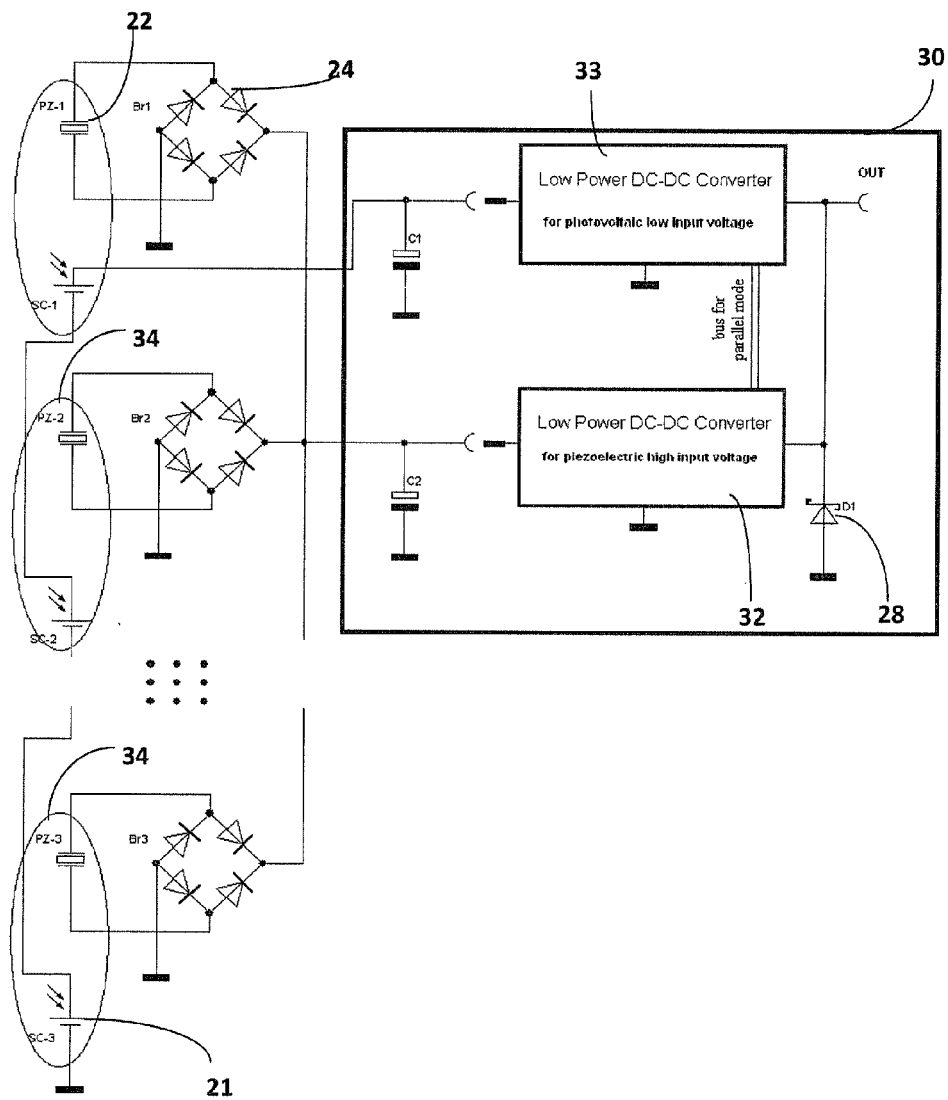
Figure 10:
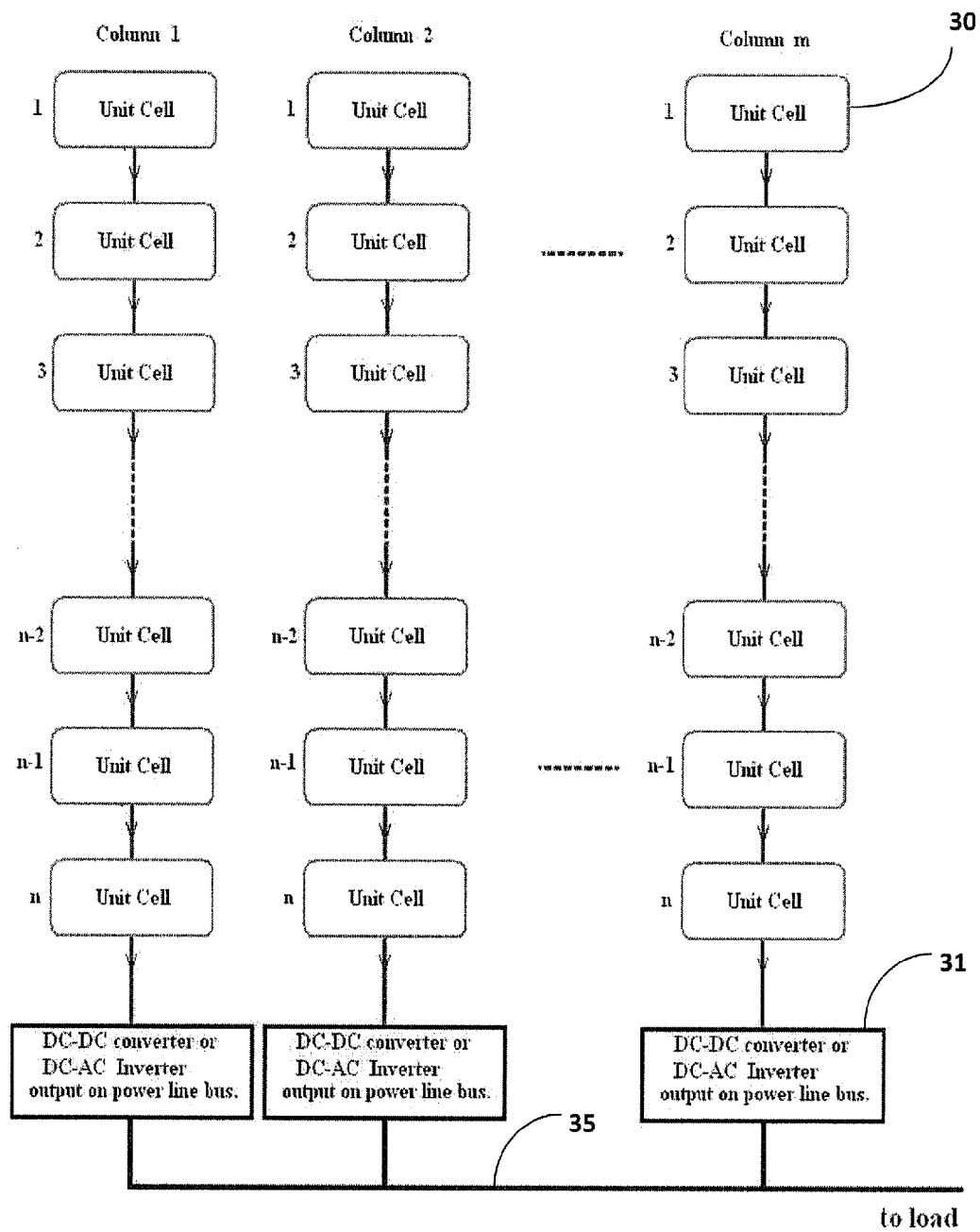

FIG. 9 is a circuit diagram showing a further unit cell according to the present invention in which a circuit connecting a plurality of piezoelectric elements is connected to a first DC-DC converter and a circuit connecting a plurality of photovoltaic elements is connected to a second DC-DC converter; and FIG. 10 is a schematic of the power conversion array of FIG. 8 showing multiple series-connected unit cells connected to an output power line bus via respective DC-DC converters or DC-AC inverters.

Figure 1:
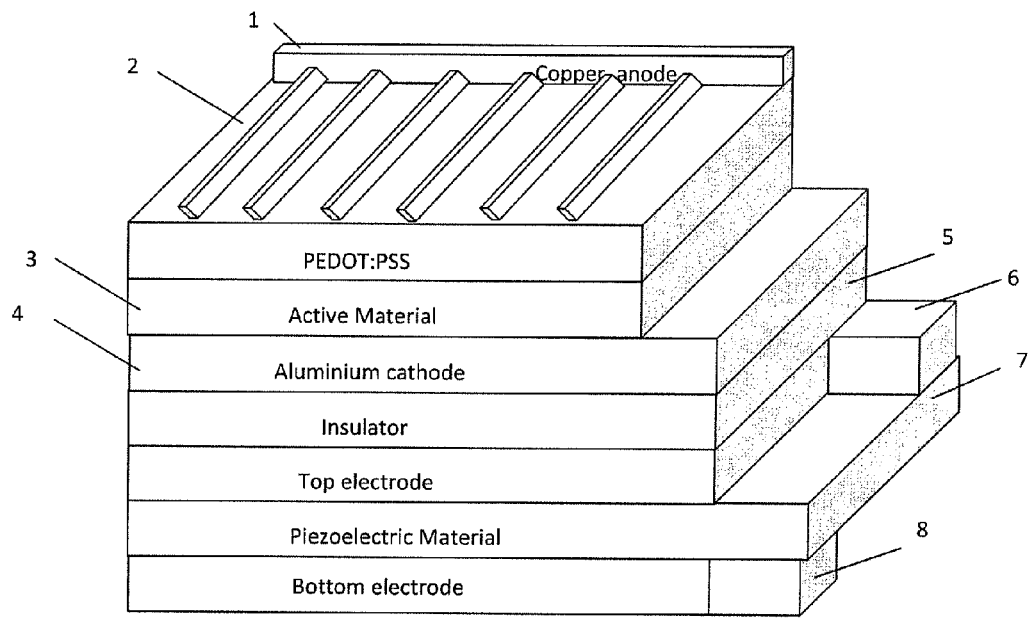
FIG. 1 is a perspective drawing of a section of a laminar piezoelectric-photovoltaic structure, such as a film, according to one embodiment of the present invention.
Figure 2:
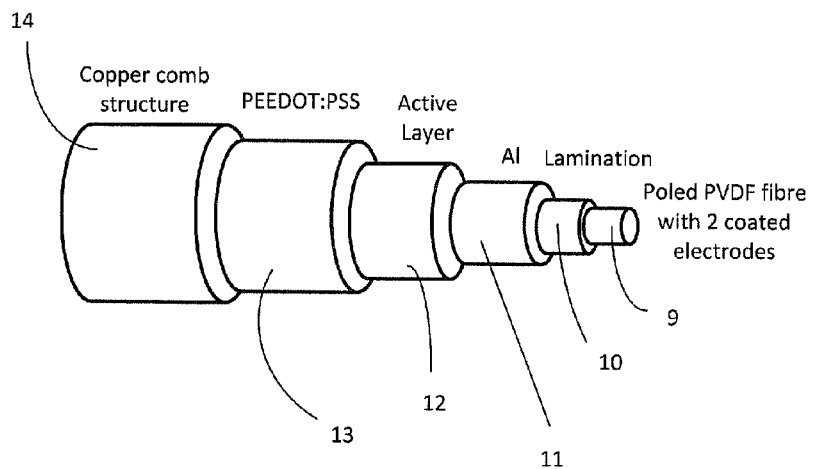
FIG. 2 is a perspective drawing of a section of a concentric piezoelectric-photovoltaic structure, such as a fibre, according to another embodiment of the present invention.
Figure 3:
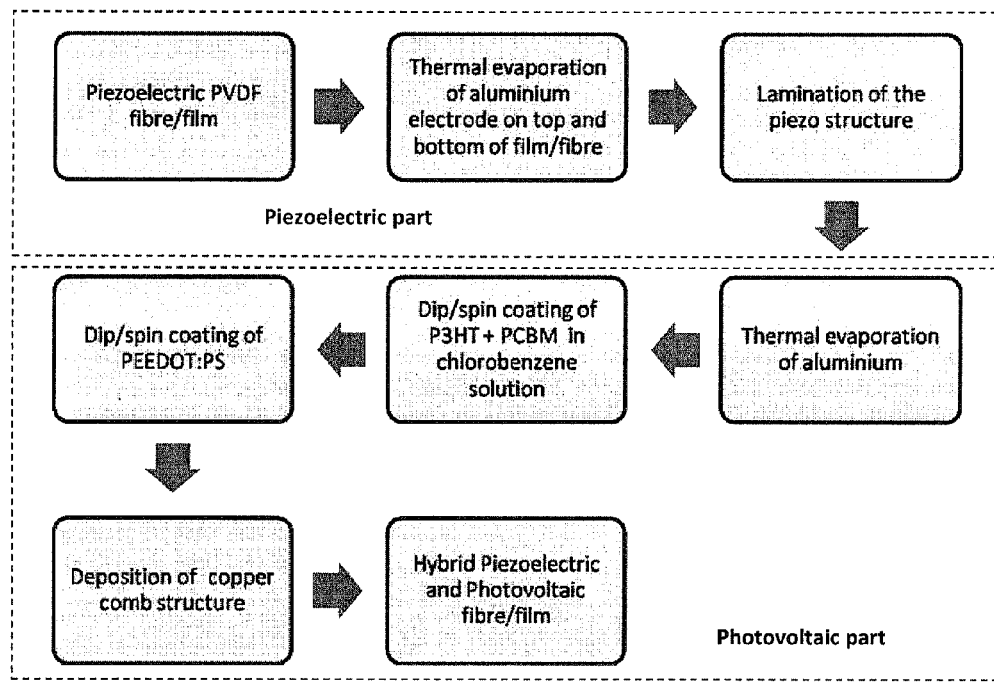
FIG. 3 is a flowchart showing a method for preparing the piezoelectric-photovoltaic structures of FIGS. 1 and 2.

FIGS. 1 and 2 show the structures of laminar and concentrically-layered hybrid piezoelectric-photovoltaic structures, such as a film and a fibre, respectively. The fibre or film is prepared using a piezoelectric polymer, such as PVDF, as a substrate for the photovoltaic cell. Organic based charge donor and acceptor photovoltaic materials such as P3HT and PCBM and electrode materials such as aluminium and copper are then deposited layer-by-layer on the PVDF fibre or film to develop an inverted organic solar cell. A method for producing such fibres and films is set out in more detail below, as indicated in FIG. 3.

I. Electrode Deposition onto Piezoelectric Polymer Substrate:

A piezoelectrically polarised (poled) PVDF substrate in the form of a fibre (9) or film (7) is deposited with a pair of metallic electrodes (6, 8) and then laminated with an insulator layer (5, 10). The two electrodes may substantially cover the top and bottom surfaces of a film substrate, respectively, or may substantially cover the top 180 degrees and the bottom 180 degrees of a fibre substrate surface, respectively. PVDF is chosen for the substrate as it is a well-known piezoelectric polymer with a charge displacement coefficient, $d_{33}$, of approximately 35 pC/N for a film of thickness 25 μm. Apart from possessing a high $d_{33}$ constant, it is a very stable polymer. PVDF is easy to melt-extrude into thin films or fibres, having a relatively low melting temperature of 175° C.

Alternative materials for the piezoelectric substrate may include polypropylene, nylon, and any other polymer which may form a suitably resilient and stable substrate fibre or film and may be piezoelectrically polarised. The electrodes on the piezoelectric substrate are deposited by thermal evaporation of a good electrical conductor. Alternatively, if the substrate is in the form of a film, the electrodes may be deposited by doctor blading of a conducting paste. In the case of a film, a layer of electrical insulation (5) is then laminated onto the top electrode of the piezoelectric part; for a fibre, the insulation (10) is laminated onto both electrodes to substantially enclose the fibre.

II. Cathode Deposition onto the Laminated Piezoelectric Part:

An aluminium cathode (4, 11) is deposited onto the laminated piezoelectric part (7, 9) by thermal evaporation. The cathode material should have a work function lower than that of the anode. Aluminium is chosen as the cathode material as it has a lower work function than copper. In a preferred embodiment, a thin film of Aluminium with a thickness of at least 250 nm is deposited onto the laminated piezoelectric PVDF film (7) or fibre (9).

III. Solution for Forming a Coating of Electron Donor-Acceptor Material:

P3HT and PCBM are mixed in a ratio of 1:1 by weight in chlorobenzene, which is thought to maximise the quantum conversion efficiency of the solar cell. The solution is prepared with a concentration of the P3HT+PCBM active material of 10 mg/ml, which is thought to produce higher quantum efficiency than any other concentration. The solution is then stirred for 9 hours at 200 rpm. Throughout the stirring operation, the mixture is kept in an opaque, airtight container.

IV. Application of Electron Donor-acceptor Layer by Spin/Dip Coating:

A P3HT+PCBM active layer (3, 12) is deposited onto the aluminium-coated PVDF substrate using spin-coating or dip-coating equipment. Spin coating may produce an active layer with a thickness of 100-150 nm for a speed of 1000 rpm from a 10 mg/ml concentration of P3HT and PCBM dissolved in chlorobenzene. This is thought to be an optimal thickness for achieving high quantum conversion efficiency. A spin-coating speed of 200 rpm for the first 10 seconds, followed by 500 rpm for another 10 seconds, and finally 1000 rpm for 40 seconds, is used to coat the active material. This several-step procedure was adopted in order to obtain a uniform thickness. During coating, a mask covers the structure in order to keep certain areas free from active material in order to allow access to the aluminium cathode for later connecting leads.

V. Annealing of the Structure Prepared with Steps I to IV:

Annealing of the organic active photovoltaic material has proven to produce better quantum conversion efficiency of the solar cell. The structure built with the above steps I to IV is annealed at a temperature of 110° C. An annealing temperature of 250° C. would produce higher efficiency than this lower temperature, but exceeds the melting point and Curie point of PVDF, and would therefore damage the piezoelectric substrate. Hence, a maximum of 110° C. is chosen.

VI. Application of the Electron Blocker (Hole Extractor) Layer by Spin/Dip Coating:

A layer of PEDOT:PSS (2, 13) is used as a hole injector/extractor layer from the active layer to the anode of the solar cell. It also acts as an electron blocking layer preventing diffuse electron drift towards the anode. A solution of PEDOT:PSS is spin coated onto the active layer with a high speed of up to 5000 rpm, to obtain a thickness of about 40-50 nm. For both steps IV and VI, spin coating is preferred for a laminar/film structure; if the structure is a fibre, then it is preferably dip coated in both steps.

VII. Annealing of the Structure Prepared with Steps I to VI:

Annealing of the electron blocking or hole extraction material improves the quantum conversion efficiency of the solar cell. The structure built following the above steps I to VI is annealed at 110° C. for a short time of about 30 minutes. Annealing time and temperature of PEDOT:PSS do not produce much variation in the efficiency of the organic solar cells.

VIII. Thermal Evaporation of Copper Comb Structure, 1 and 14:

Anode deposition on the top of the solar cell should be sparsely distributed so as to block as little sunlight as possible. A comb structure with thin fingers spreading from a spine (as shown in FIG. 1) may achieve good transport of electrons to the anode metal with minimal sunlight blocking. The anode covering a fibre (as in FIG. 2) should also have a sparsely distributed form such as a comb or lattice structure (not shown). Copper is chosen as the anode material as it has a higher work function than the cathode material, aluminium. The copper anode is deposited at room temperature using thermal evaporation equipment. A copper thickness greater than 200 nm is preferable for achieving a relatively low resistance across the leads that will be connected to the solar cell.

In use, the photovoltaic part of the hybrid structure generates a current across the anode and cathode in response to sunlight and the piezoelectric part of the structure generates a fluctuating voltage across the electrode pair in response to movement. The current from the photovoltaic part and the voltage from the piezoelectric part independently provide electrical energy from solar or mechanical energy sources. This energy may be stored or used, for example as set out below.

In one embodiment of the present invention, the efficiency of the hybrid structure is improved by depositing a layer of LiF (lithium fluoride) over the aluminium cathode (4, 11) prior to applying the PCBM+P3HT active layer (3, 12). This acts as a hole-blocking layer.

In another embodiment, a colloidal solution of single-walled and multi-walled carbon nano-tubes (SWCNT and MWCNT) is included in the mixture of active materials. This may improve the efficiency of the organic solar cell by improving the diffusion of charge carriers from the active materials to the electrodes.

In yet another embodiment, dye sensitised solar cells are deposited on top of the PVDF film or fibre (7, 9) substrate which forms the piezoelectric part of the hybrid cell.

Various other types of flexible piezoelectric substrates such PFC (piezoelectric fibre composite), piezoelectric polypropylene (PP), nylon, etc., can also be used instead of PVDF.

Figure 4:
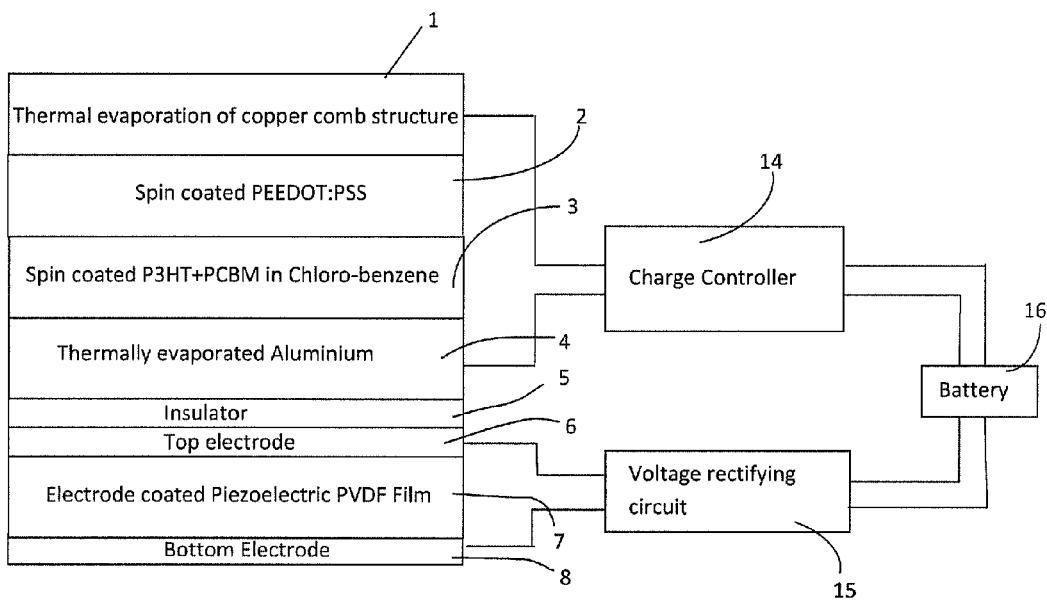
FIG. 4 is a schematic of a power conversion system according to another embodiment of the present invention, which includes the piezoelectric-photovoltaic structure of FIG. 1.
Figure 5:
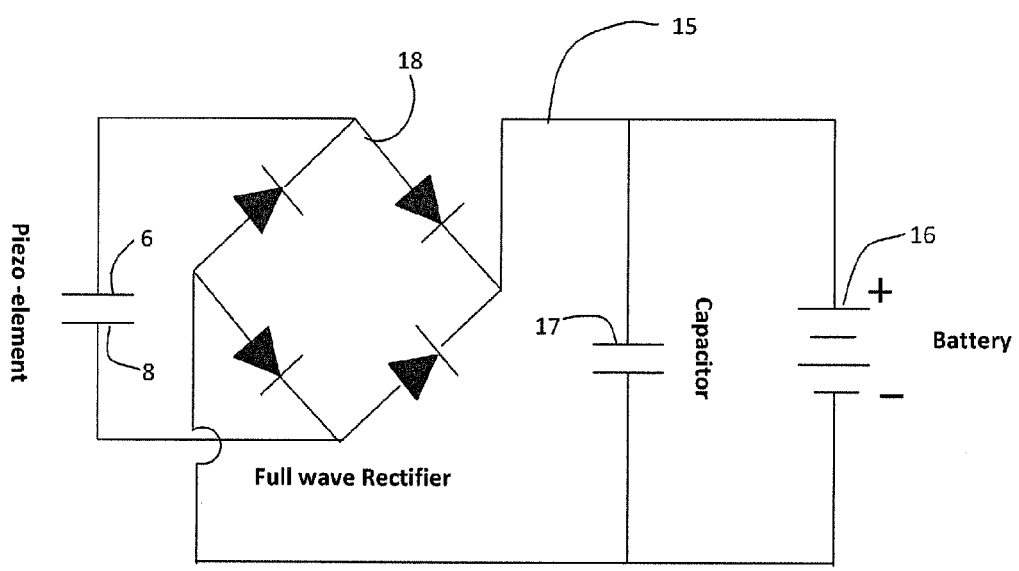
FIG. 5 is a circuit diagram setting out a rectifier circuit suitable for use in the power conversion system of FIG. 4.

IX Basic Circuit for Combining Solar and Piezoelectric Energy:

In an embodiment shown in FIG. 4, the anode (1) and cathode (4) of the photovoltaic part of the hybrid structure are connected to a charge controller (14) which is in turn connected to an energy storage unit such as a battery (16) or a capacitor. The charge controller may prevent the battery from discharging when there is no sunlight. The top and bottom electrodes (6, 8) of the piezoelectric part of the hybrid structure are connected to a rectifying circuit (15) which is also in turn connected to a battery or other storage device (16). Each of the two circuits may be connected to the same storage device or to a separate one. The rectifying circuit (as shown in FIG. 5) may comprise a bridge rectifier composed of four diodes (18) and a capacitor (17). The diodes and the capacitor convert the fluctuating frequency and amplitude voltage signal to a steadier DC voltage signal.

The energy conversion circuitry of the piezoelectric part (15) may also be modified by adding an inductor and a digital switch (synchronised switch harvesting on inductor) for more efficient conversion from a fluctuating frequency and voltage to a more constant DC voltage.

In another embodiment, the energy is utilised online without storing it in an electrical storage device such as battery or a capacitor. For example, if the solar energy and/or mechanical energy such as winds, tides, waves, or rain are abundant, and/or energy usage is low, then the electricity generated may be used directly without the requirement for any storage device.

X Further Circuits for Energy Harvesting and Power Transmission:

Further embodiments concern circuitry that converts the voltages generated by the piezoelectric and photovoltaic parts into a constant DC voltage and also prevents the stored energy from discharging through the photovoltaic and piezoelectric parts of the device. This may enable the device to function as an efficient energy harvesting device, supplying power that is efficiently converted from mechanical and solar energy.

Figure 6:
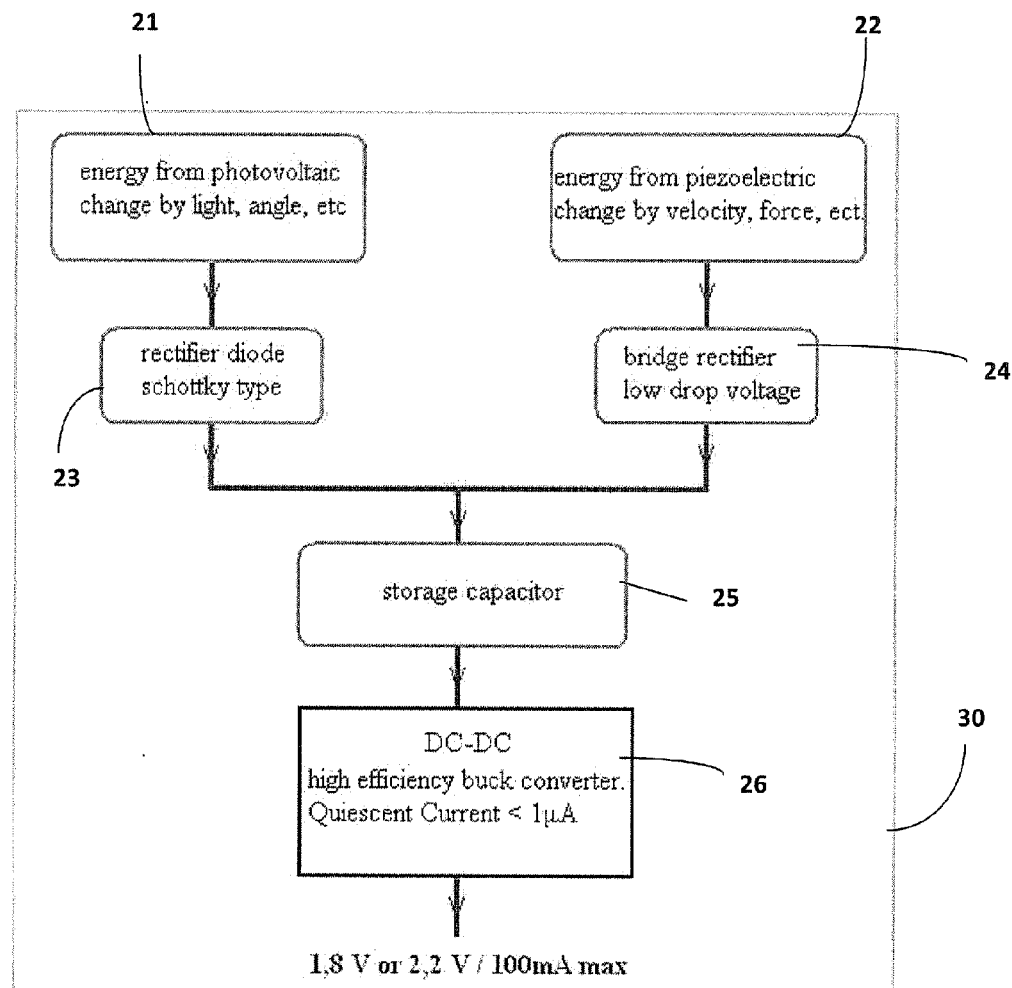
FIG. 6 is a schematic of an energy conversion system unit cell according to further embodiments of the present invention.

A schematic layout of the circuitry is shown in FIG. 6, where charge is collected by photovoltaic (21) and piezoelectric (22) parts of the energy harvester separately by different rectifying elements (23, 24). The photovoltaic part (21) of the hybrid cell produces a constant DC voltage, and hence the rectifying element (23) used may be an ordinary Schottky type of single diode rectifier, while the piezoelectric part (22) of the hybrid cell uses an LTC3588 integrated chip (27), supplied by Linear Technology Corporation (Milpitas, Calif.), which comprises a low-loss, full wave bridge rectifier, coupled with a high efficiency buck converter, to convert the randomly varying AC signal to a constant DC voltage. The integrated chip (IC) has four output voltages: 1.8 V, 2.5 V, 3.3 V, and 3.6 V, with an input voltage set at 20 V with a protective shunt. Both the rectifying elements (23, 24) from photovoltaic part (21) and piezoelectric part (22) are then connected to a storage capacitor (25) which is then connected to a DC-DC high efficiency buck converter (26).

Figure 7:
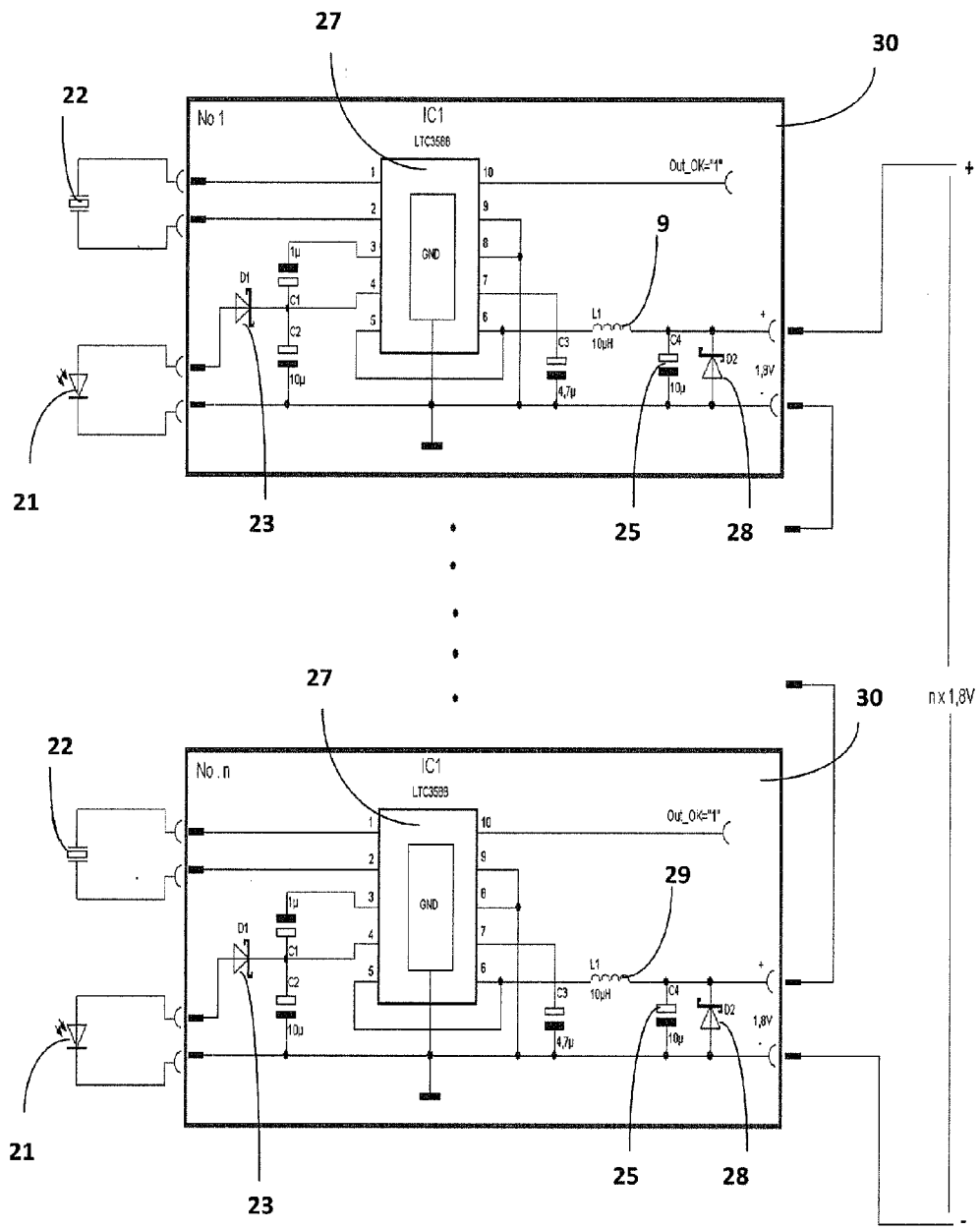
FIG. 7 is a circuit diagram showing a plurality of the unit cells of FIG. 6, each comprising one or more piezoelectric elements and one or more photovoltaic elements, where the unit cells are connected in series to form a power conversion array according to another embodiment of the present invention.

FIG. 7 shows the circuit diagram of each unit cell (30) of the hybrid energy harvester connected in series. Each unit cell (30) comprises a Schottky diode (23) to regulate the voltage from the photovoltaic part (21) of the hybrid cell. A capacitor connected from the diode to an LTC3588 IC (27) is also connected by the piezoelectric part of the hybrid cell (22). The piezoelectric part of the energy harvester is connected to the LTC3588 IC through the PZ1 and PZ2 pins, and the photovoltaic part of the device is connected to the LTC3588 IC through the Vin and GND pins. The charge/electrical energy from the photovoltaic part is stored in capacitor C2 through the diode; the same capacitor also stores the charge/electrical energy from the piezoelectric part of the hybrid energy harvester through the full wave 4-diode rectifier integral to the LTC3588 IC.

The electrical input at the Vin at pin 4 of the LTC3588 IC is the sum of the charge/electrical energy from both photovoltaic and piezoelectric parts of the hybrid energy harvester. Voltage output Vout at pin 6 of the LTC3588 IC is connected to inductor L2 (29) and capacitor C4 (25) which form a smoothing circuit for regulating the output voltage. This output voltage is then connected across diode D2 (28), which serves to prevent the reverse flow of current. Another Vin at pin 7 (an internal low voltage rail which serves as the gate drive for the buck converter NMOS switch of the IC) is connected to the other electrode of the photovoltaic part of the hybrid harvester through a capacitor C3. This is then connected to the ground (GND) of LTC3588 IC along with pins 9 and 8. (This is in contrast with the piezoelectric part, where both the electrodes are connected to respective PZT1 and PZT2 terminals of the IC).

In the specific embodiment shown, the voltage output at the ground (GND) pin and pin 6 of the LTC3588 is about 1.8 V. It can be seen in FIG. 7 that several (n) basic unit cells (30) are connected in series. The overall voltage of the whole series is n times the voltage output of the unit cell, i.e. (n×1.8) V. If any one of the basic units were non-functioning, for example due to any damage to the unit or due to an insufficient level of solar energy, then the unit cell will be bypassed via its bypass diode D2 (28), so that the series output voltage would be ((n−1)×1.8) V.

The electronic circuitry commonly used in commercial solar cells, for collecting the photovoltaic charge and storing it in an energy storage device, may fail completely in the event that one of the many cells connected into the array is not functioning. The series arrangement with bypass diode D2 (28) is advantageous in that the failure of one or a small number of unit cells within the larger serial array of solar cells does not prevent the energy harvesting device from functioning; rather, the array continues to supply the power generated by the remaining solar cells that are still functional.

The basic unit cell shown in FIG. 7 is intended for a hybrid photovoltaic-piezoelectric energy harvester such as where the hybrid piezoelectric and photovoltaic elements are in a relatively large-scale form such as film or strip elements. For smaller-scale elements, such as in the form of fibres, each element would act as a hybrid harvester cell and would therefore require a respective LTC3588 IC (27), which may be prohibitive in terms of cost or space. In order to overcome this problem, several or many piezoelectric elements (22), such as fibres or parts of fibres, may each be connected to a respective high-efficiency, full wave bridge rectifier (24), as shown in FIG. 8. The full wave bridge rectifiers are then connected in parallel to a storage capacitor C2. Several photovoltaic parts (21) of the hybrid cells may be connected in series to the diode D1, as shown in FIG. 8.

The number of fibres connected in series before connecting to the IC is limited by the voltage input limit of the IC which is 20 V for LTC3588. When using a large number of fibres, this limit may be increased by choosing a suitable commercially available IC similar to LTC3588, or by replacing LTC3588 with two low-power DC-DC converters, as shown in FIG. 9. Several piezoelectric parts (22) of the hybrid cells are each connected to a respective high-efficiency bridge wave rectifier (24). These rectifiers are connected in series and the final voltage/charge is stored in capacitor C2 which is connected to a high-voltage, low-power DC-DC converter (32). The photovoltaic parts of the hybrid fibres are connected in series and the voltage/charge is stored in capacitor C1 which is connected to a low-voltage, low-power DC-DC converter (33).

FIG. 10 is a schematic showing several columns of unit cells (30), each column comprising a set of unit cells connected in series to either a DC-DC converter or DC-AC inverter (31), depending on the nature of load required. These several columns are then connected in parallel to an output power line bus (35) in accordance with current rating requirements of the energy harvester.

Where several hybrid elements are connected in series to a single rectifying circuit, the conversion efficiency is considerably lower than when each element is connected to a respective rectifying circuit. In the embodiments shown in FIGS. 6-10, this issue is addressed by connecting individual piezoelectric elements to a respective rectifying circuit before connecting the rectifying circuits to a storage capacitor coupled with a DC-DC convertor within each unit cell (30) of the harvester (as shown in Figures 6-9). This allows many piezoelectric elements to be used without significant loss of conversion efficiency (as shown in FIGS. 7-9). Furthermore, it allows several or many such unit cells to be connected in series directly either to a load or to a DC-DC converter or DC-AC inverter (as shown in FIG. 10), achieving a high efficiency of charge collection.

As an example of one possible usage of the invention, hybrid piezoelectric-photovoltaic material fibres and/or films may be assembled in arrays or clusters in the form of leaves on a tree or branch. For example, an array of unit cells (30) comprising photovoltaic and piezoelectric elements, as shown in FIG. 10, or an array of hybrid elements (34) as shown in FIG. 9, may form a tree or may form branch or leaf units within such tree structures. These are then exposed to sunlight, wind and/or rain, to scavenge energy from the environment for storage or distribution.

The above embodiments are described by way of example only. Many variations are possible without departing from the scope of the invention as defined in the appended claims.

The invention claimed is:

1. A piezoelectric-photovoltaic structure for converting solar and mechanical energy into electrical energy, the piezoelectric-photovoltaic structure having a plurality of superposed layers including a photovoltaic layer and a piezoelectric substrate that comprises a piezoelectric polymer, wherein:
   the piezoelectric substrate is interposed between a top electrode and a bottom electrode;
   the photovoltaic layer is interposed between an anode layer and a cathode layer;
   an insulation layer separates the piezoelectric substrate and the top and bottom electrodes from the photovoltaic, cathode, and anode layers;
   the insulation layer is laminated onto the top electrode; and
   the cathode layer is a film deposited onto the insulation layer.

2. A piezoelectric-photovoltaic structure according to claim 1 wherein the anode and cathode layers are metallic, the anode layer having a higher work function than the cathode layer.

3. A piezoelectric-photovoltaic structure according to claim 1 wherein the cathode layer and the photovoltaic layer are separated by an interposed layer of lithium fluoride.

4. A piezoelectric-photovoltaic structure according to claim 1 wherein the photovoltaic layer comprises an outer sub-layer of a transparent electron blocker (hole extractor) polymer and an inner sub-layer of electron donor and electron acceptor (donor-acceptor) polymers.

5. A piezoelectric-photovoltaic structure according to claim 1 comprising an elongate substantially cylindrical body with layers superposed concentrically.

6. A piezoelectric-photovoltaic structure according to claim 1 comprising a planar body having said layers superposed substantially parallel thereto.

7. A piezoelectric-photovoltaic structure according to claim 1 wherein the piezoelectric substrate comprises dispersed piezoelectric ceramic particles.

8. A power conversion system for converting solar and mechanical energy into electrical energy comprising: a piezoelectric-photovoltaic structure according to claim 1; a first circuit connected to the piezoelectric substrate; and a second circuit connected to the photovoltaic layer, wherein at least one of the first and second circuits is connected to a DC-DC converter.

9. A power conversion system according to claim 8 wherein the first circuit is connected, in parallel with a storage capacitor, to a DC-DC converter.

10. A power conversion system according to claim 9 wherein the second circuit is connected, in parallel with said storage capacitor, to said DC-DC converter.

11. A power conversion system according to claim 8 wherein the second circuit includes a voltage regulator.

12. A power conversion system according to claim 11 wherein the voltage regulator is a diode connected in series with the photovoltaic element.

13. A power conversion array comprising a set of power conversion systems according to claim 8 connected in series at their output terminals.

14. A piezoelectric-photovoltaic structure according to claim 5 wherein the insulation layer is laminated onto both of the top electrode and the bottom electrode to substantially enclose the piezoelectric substrate.

15. A method of forming a piezoelectric-photovoltaic structure, the method including the steps of providing a piezoelectric substrate that comprises a piezoelectric polymer and superposing a photovoltaic layer over the piezoelectric substrate;
   wherein the method includes the steps of depositing a top electrode and a bottom electrode onto the piezoelectric substrate and laminating an insulation layer onto the top electrode prior superposing the photovoltaic layer; and
   wherein superposing the photovoltaic layer includes the step of depositing a cathode layer onto the insulation layer as a film.

16. A method of forming a piezoelectric-photovoltaic structure according to claim 15 wherein superposing the photovoltaic layer includes the steps of overlaying a layer comprising electron donor and electron acceptor polymers over the cathode layer, depositing a layer of a transparent electron blocker (hole extractor) polymer onto the electron donor-acceptor polymer layer, and depositing an anode layer onto the transparent electron blocker polymer layer.

17. A method of forming a piezoelectric-photovoltaic structure according to claim 15 wherein the step of providing a piezoelectric substrate includes forming said piezoelectric substrate by an extrusion process.

18. A method of forming a piezoelectric-photovoltaic structure according to claim 15 wherein the step of depositing the cathode layer onto the insulation layer comprises deposition of the cathode layer onto the insulation layer by thermal evaporation.

19. A method of forming a piezoelectric-photovoltaic structure according to claim 15 wherein the insulation layer is laminated onto both of the top and bottom electrodes to substantially enclose the piezoelectric substrate.

* * * * *